US012755779B2

(12) United States Patent
Sidhu et al.

(10) Patent No.: US 12,755,779 B2
(45) Date of Patent: Oct. 6, 2026

(54) LOW POWER READ CIRCUIT FOR MULTI-BANK MEMORY

(71) Applicant: MediaTek Singapore Pte. Ltd., Singapore (SG)

(72) Inventors: Jaswinder Singh Sidhu, Bengaluru (IN); Manish Trivedi, Bengaluru (IN); Sumanth Katte Gururajarao, San Jose, CA (US); Sagar Y Abachi, Bengaluru (IN)

(73) Assignee: Media Tek Singapore Pte. Ltd., Singapore (SG)

( * ) Notice: Subject to any disclaimer, the term of this patent is extended or adjusted under 35 U.S.C. 154(b) by 95 days.

(21) Appl. No.: 18/815,830

(22) Filed: Aug. 26, 2024

(65) Prior Publication Data

US 2025/0078915 A1 Mar. 6, 2025

(30) Foreign Application Priority Data

Aug. 28, 2023 (IN) ............................. 202321057572

(51) Int. Cl.
*G11C 11/418* (2006.01)
*G11C 11/419* (2006.01)

(52) U.S. Cl.
CPC .......... *G11C 11/418* (2013.01); *G11C 11/419* (2013.01)

(58) Field of Classification Search
CPC ............................ G11C 11/418; G11C 11/419
USPC .................................................. 365/189.011
See application file for complete search history.

(56) References Cited

U.S. PATENT DOCUMENTS

2020/0402575 A1* 12/2020 Yoon .................. G11C 13/0026

* cited by examiner

*Primary Examiner* — Fernando Hidalgo
(74) *Attorney, Agent, or Firm* — Winston Hsu

(57) ABSTRACT

A multi-bank memory includes: a pair of far banks coupled to a first word line and a first pair of local bitlines, respectively; a pair of near banks coupled to a second word line and a second pair of local bitlines, respectively; a far global bit line coupled to the first pair of local bitlines; a first NAND gate having a first input coupled to the second pair of local bitlines and a second input coupled to the far global bit line; a near global bit line coupled to the output of the first NAND gate; and a global input/output (I/O) circuit, coupled to the near global bit line, for outputting data.

7 Claims, 5 Drawing Sheets

LOW POWER READ CIRCUIT FOR MULTI-BANK MEMORY

BACKGROUND

The invention is directed to multi-bank memories, and more specifically, to a low power read circuit for a multi-bank memory that comprises a split global bit line.

Modern electronic devices such as smart phones have high memory requirements, particularly when they are used for high performance applications such as gaming. SRAMs are typically used as memory storage, wherein active power operations such as read and write consume the most power. In order to balance power consumption with performance, low power SRAM schemes have been developed.

Refer to FIG. 1, which is a diagram of a multi-bank SRAM 100, which can reduce power consumption by splitting access operations across the multiple banks. As shown in the diagram, the SRAM 100 comprises eight memory banks Bank 0~Bank 7. A local I/O circuit is disposed between each pair of banks, Bank 0 and Bank 1, Bank 2 and Bank 3, Bank 7 and Bank 6, and Bank 5 and Bank 4. A global I/O circuit is coupled between the left-hand side and the right-hand side of the SRAM 100. A global bitline couples banks Bank 0~Bank 3 to the global I/O circuit. Local bitlines (split into top local bitline and bottom local bitline) couple each bank to its corresponding local I/O circuit. A wordline driver is activated by a control circuit CTRL, and is used to assert wordlines for performing access operations such as write or read.

For the access operations, data read from or to be written to a selected bitcell of one of the memory banks will be placed on the local bitline. Bank access operations for each bank will occur via the particular bank's access circuitry and dedicated local wordlines and bitlines, wherein only one bank will be accessed at one time in the multi-bank SRAM array 100.

Although the multiple banks can reduce overall power consumption by reducing capacitance on the local bitlines, the shared global bitline among the different memory banks still results in high power consumption during access operations.

SUMMARY

It is therefore an objective of the instant application to provide a multi-bank SRAM design which has reduced power consumption.

A multi-bank memory according to an exemplary embodiment of the present invention comprises: a pair of far banks coupled to a first word line and a first pair of local bitlines, respectively; a pair of near banks coupled to a second word line and a second pair of local bitlines, respectively; a far global bit line coupled to the first pair of local bitlines; a first NAND gate having a first input coupled to the second pair of local bitlines and a second input coupled to the far global bit line; a near global bit line coupled to the output of the first NAND gate; and a global input/output (I/O) circuit, coupled to the near global bit line, for outputting data. During an access operation of the pair of far banks, data on the first pair of local bitlines will be carried on the far global bit line and the near global bit line, and during an access operation of the pair of near banks, data on the second pair of local bitlines will be carried on the near global bit line.

The first pair of local bit lines comprises a top local bit line coupled to a first bank of the pair of far banks and a bottom local bit line coupled to a second bank of the pair of far banks, and the pair of far banks further comprise a second NAND gate, having a first input coupled to the top local bit line, a second input coupled to the bottom local bit line, and an output coupled to the far global bit line. The second pair of local bit lines comprises a top local bit line coupled to a first bank of the pair of near banks and a bottom local bit line coupled to a second bank of the pair of near banks, and the pair of near banks further comprise a NOR gate, having a first input coupled to the top local bit line, a second input coupled to the bottom local bit line, and an output coupled to the near global bit line.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
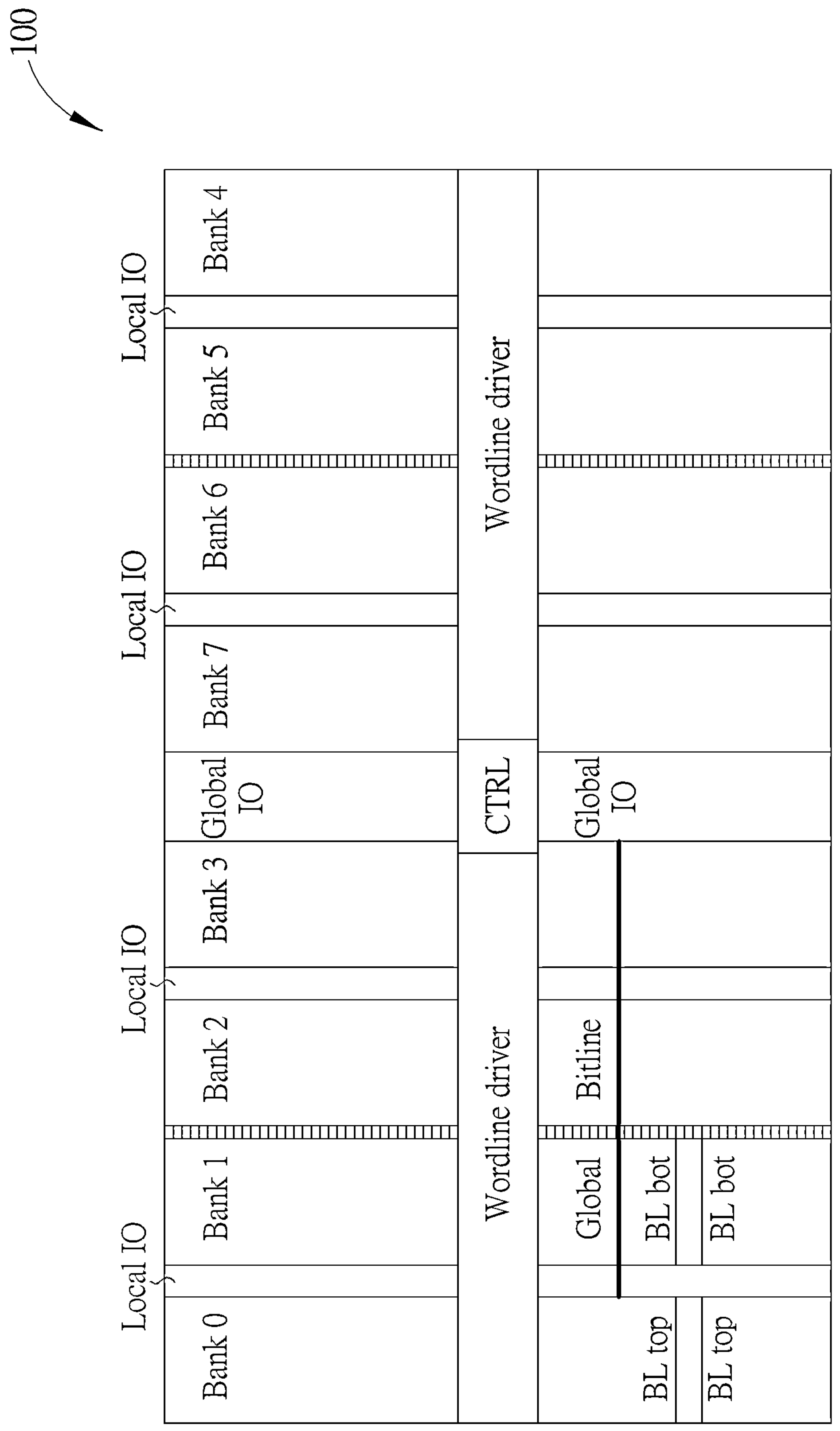
FIG. 1 RELATED ART
FIG. 1 is a diagram of a multi-bank memory according to the related art.
Figure 2:
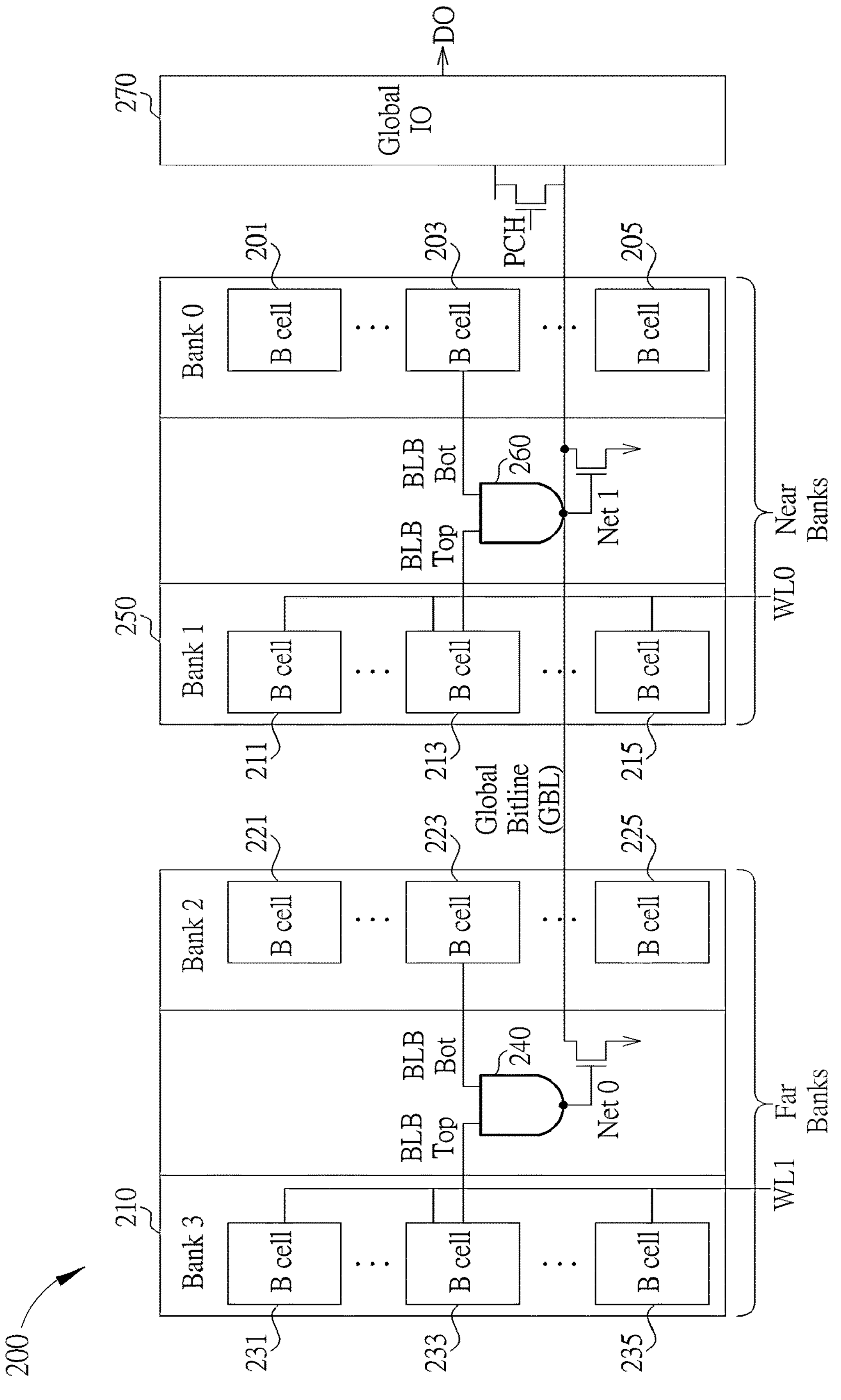
FIG. 2 RELATED ART
FIG. 2 is a diagram of four left-hand banks of a multi-bank memory according to the related art.

Refer to FIG. 2, which is a diagram of the four left-hand banks (bank 0~bank 3) of a multi-bank SRAM 200. As shown in the diagram, these four banks are split into a pair of far banks 210 comprising Bank 3 and Bank 2, and a pair of near banks 250 comprising Bank 1 and Bank 0. Each bank of the pair of far banks 210 comprises a plurality of cells 231, 233, 235, 221, 223, 225, wherein only cells of Bank 3 (231, 233 and 235) are illustrated as coupled to the wordline WL1 for simplicity. Each bank of the pair of near banks 250 comprises a plurality of cells 211, 213, 215, 201, 203, 205, wherein only cells of Bank 1 (211, 213 and 215) are illustrated as coupled to the wordline WL0 for simplicity. In both the far banks 210 and the near banks 250, a pair of local bitlines is coupled, respectively, to each bank, wherein the pair of local bitlines comprises a top local bit line BLB Top and a bottom local bitline BLB Bot. Data within the cells are read out via the top and bottom local bit lines and input to a NAND gate (240, 260). An NMOS transistor is coupled to the output of each NAND gate and acts as a multiplexer (MUX) for outputting data from the near banks 250 or the far banks 210. The output of each MUX is coupled to a global bitline (GBL), which is coupled to the global I/O circuit 270. A pre-charge circuit PCH is coupled between the global bit line and the global I/O circuit 270. In this way, access operations can occur for both near banks 250 and both far banks 210, and the resultant output data signals are muxed via the transistors to the global I/O circuit 270.

In order for normal read operations to take place, the local bitlines and the global bitline are pre-charged to a high "1". When the wordline W1 or W0 is asserted during a read operation, the corresponding local bitline will discharge, which is sensed by the corresponding NAND gate (240, 260). The NMOS input will therefore go high, which discharges the global bitline, such that data can be transmitted to the global I/O circuit 270. The pre-charge driver (PCH) will then pre-charge the global bitline GBL for a next operation.

As the global bit line is common for all array banks, the global bitline must be pre-charged regardless of which bank undergoes an access operation, which results in high power consumption for each access operation. Furthermore, the common global bitline amongst multiple banks means that the global bitline must be a long metal track, which results in high capacitance. The global bitline will therefore have a high RC delay, which can impact performance at high voltage corners. Moreover, as the global bit line must be pre-charged again after each access operation, it will be in a floating state for a certain period of time, which can give rise to false reads, due to parasitic coupling or current leakage.

Figure 3:
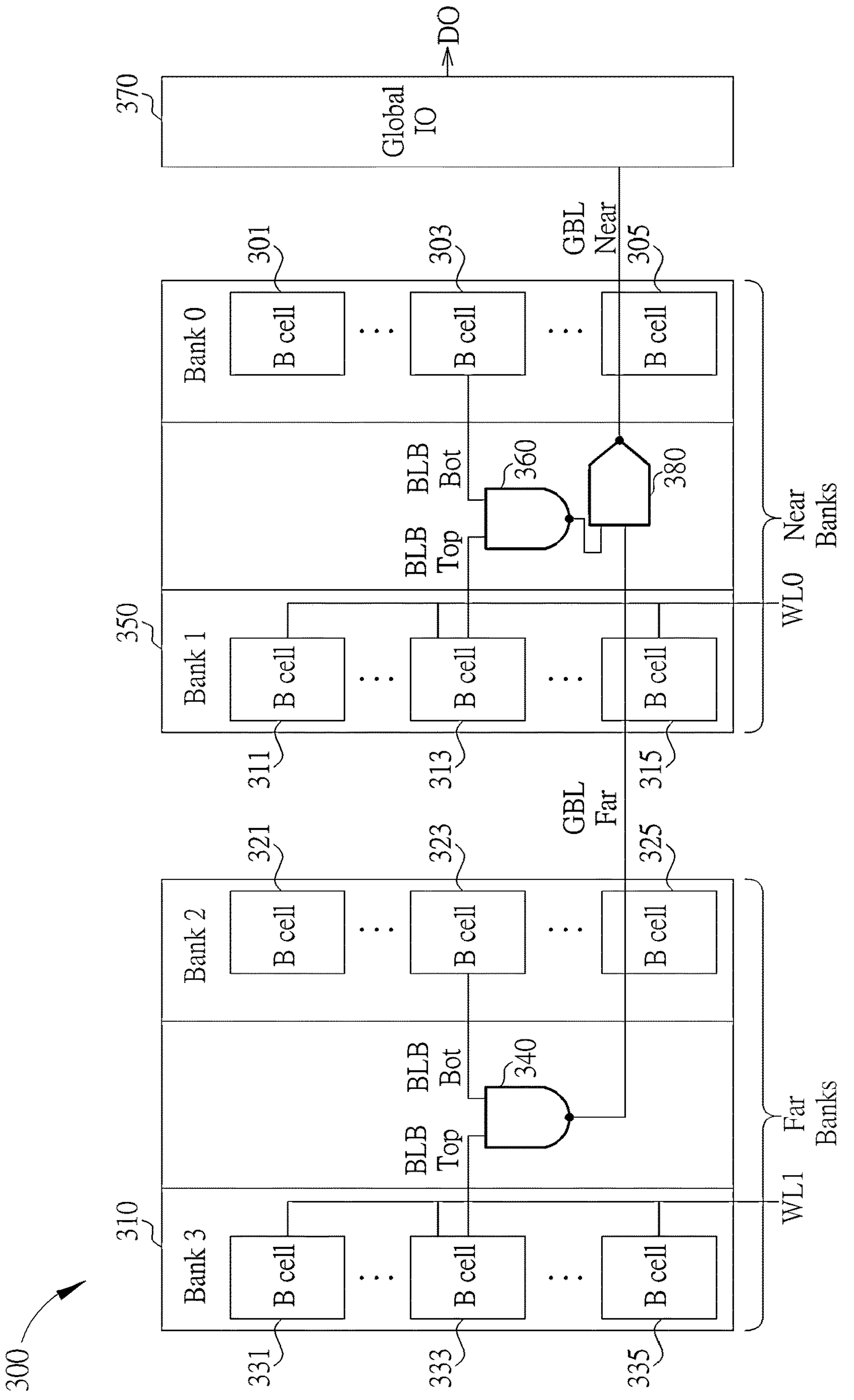
FIG. 3 is a diagram of four left-hand banks of a multi-bank memory according to an exemplary embodiment of the present invention.

FIG. 3 illustrates a structure of four banks of a multi-bank SRAM 300 according to the present invention, wherein the four banks are divided into far banks 310 and near banks 350, as in FIG. 2. Unlike the multi-bank SRAM 200 of FIG. 2, however, the global bit line is divided into two bit lines: a far global bitline (GBL Far) coupled to the output of the NAND gate 340 of the far banks 310, and a near global bitline (GBL Near). The multi-bank SRAM 300 further comprises a NOR gate 380 having a first input coupled to the output of the near bank NAND gate 360, a second input coupled to the far global bitline, and an output which couples the near global bit line to the global I/O circuit 370. The NOR gate 380 removes the need for the MUX transistors of the prior art, as the NOR gate 380 and the separation of the global bit line into a far global bit line and a near global bit line means that only data from one of the far banks 310 and near banks 350 will be output to the global I/O circuit 370. Finally, the separation of the global bit line into a far global bit line and a near global bit line which are connected directly to logic gates means that no pre-charge driver is coupled between the global bit line and the global I/O circuit 370, as pre-charging of the near global bit line after an access operation is performed via the logic gates. The structure of the memory banks is not otherwise altered.

FIGS. 4A~4D illustrate, respectively, a far bank read of the circuit shown in FIG. 2, a near bank read of the circuit shown in FIG. 2, a far bank read of the circuit shown in FIG. 3, and a near bank read of the circuit shown in FIG. 3. In each diagram, signal operation of the associated wordline, local bitlines, and global bit lines are illustrated.

As is well-known in the art, a read operation requires turning on a wordline, which then discharges the corresponding bitline. For example, if Bank 3 is accessed for a read, wordline 1 will be turned on and the bitline top will be discharged. The NAND logic (the NAND gate between bitline top and bitline bottom) will sense this discharge, and Net 0 will go high for discharging the global bit line so that the sensed charge can be transferred to the output pins (DO).

In the circuit illustrated in FIG. 2, the above operation requires the global bit line and the local bitlines to be pre-charged high, so they can be pulled down by the assertion of the wordline. This means the global bitline must be charged back to '1' by the pre-charge driver PCH at the end of each read operation.

Figure 4A:
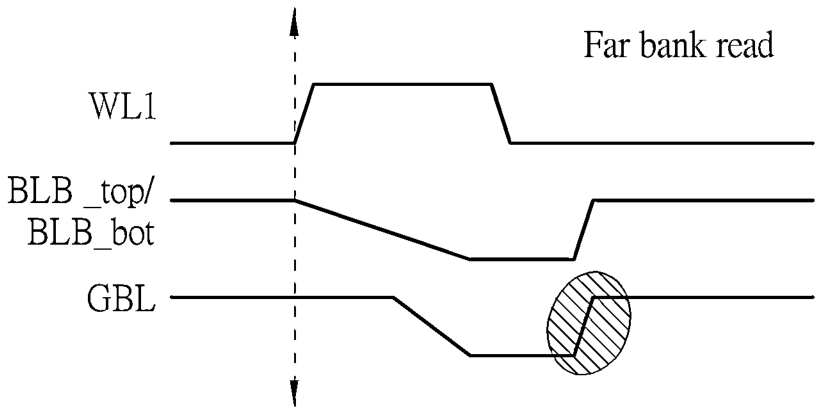
FIG. 4A RELATED ART
FIG. 4A is a diagram of signals involved in a read operation of a far bank of the multi-bank memory illustrated in FIG. 2.

Refer to FIG. 4A, which illustrates a read for the far banks 210 of the circuit 200 shown in FIG. 2. The word line WL1 is asserted and goes high in order for an access operation of one bank of the far banks 210 to occur. Data is read out on the corresponding top or bottom local bitline, which discharges, going low in response to WL1 going high. The global bit line has been pre-charged before WL1 goes high. In response to data being read out on the top/bottom local bitline, the global bitline will be pulled down such that the data can be transferred to the global I/O circuit 270. After the data has been read out, the global bit line will again be pre-charged by the pre-charge driver PCH, indicated by the shaded circle, as the wordline has stopped being asserted.

Figure 4B:
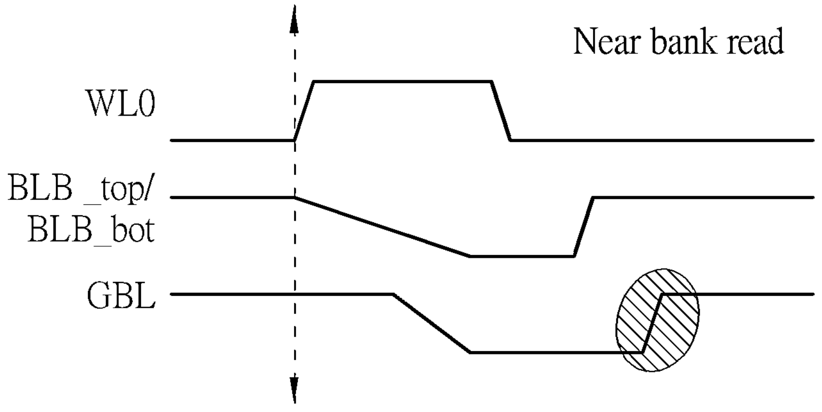
FIG. 4B RELATED ART
FIG. 4B is a diagram of signals involved in a read operation of a near bank of the multi-bank memory illustrated in FIG. 2.

FIG. 4B illustrates a read access operation for the near banks 250. As in FIG. 4A, the wordline will be asserted (WL0 for the near bank read), such that data can be read out on the top/bottom local bitline, which will go low in response to the assertion of WL0. Again, the global bitline has been pre-charged, such that it will be pulled down by the top/bottom local bitline going low. As in FIG. 4A, the global bitline must be pre-charged by the pre-charge driver PCH after the read operation has finished.

Figure 4C:
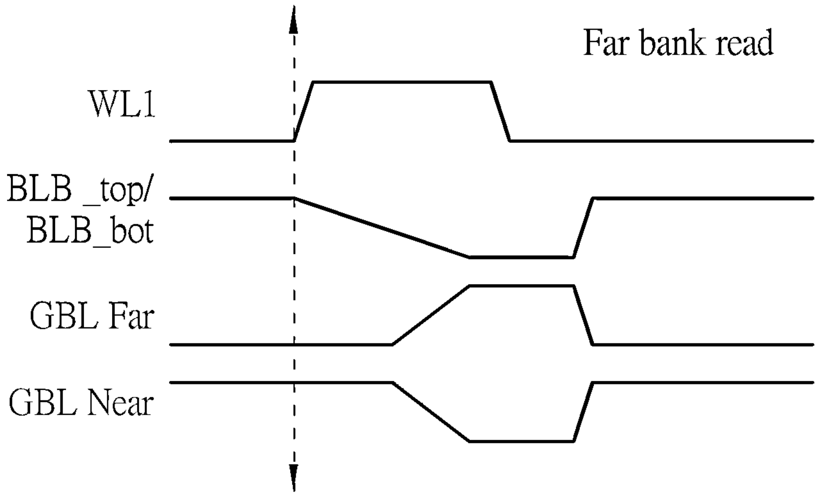
FIG. 4C is a diagram of signals involved in a read operation of a far bank of the multi-bank memory illustrated in FIG. 3.

Refer to FIG. 4C as well as FIG. 3. FIG. 4C is a signals diagram of a read access operation of the far banks 310 illustrated in FIG. 3. The operation of the word line WL1 and the top/bottom local bitlines will be the same as in FIG. 4A. Only the near global bitline is pre-charged, and this is performed by the NOR gate 380. In response to the top/bottom local bitlines being pulled down, the far global bitline will go high, and the near global bitline will be pulled down. After the read access operation is completed and the top/bottom local bitlines are asserted again by the word line WL1 being pulled down, GBL Far will be pulled down such that GBL Near is pre-charged again. As both GBL Far and GBL Near are coupled to logic gates (NOR gate 380 and NAND gate 340) which are always driven by signals no matter which bank is being accessed, neither global bitline will be in a floating state at any point during an access operation.

Figure 4D:
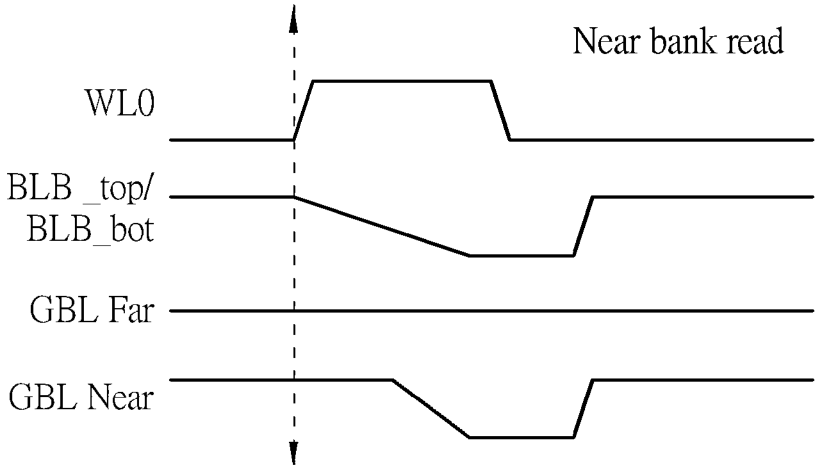
FIG. 4D is a diagram of signals involved in a read operation of a near bank of the multi-bank memory illustrated in FIG. 3.

Refer to FIG. 4D, which illustrates a read access operation of the near banks 350 illustrated in FIG. 3. The assertion of the wordline WL0 and the pulling down of the top/bottom local bitlines is the same as in FIG. 4B. As in FIG. 4C, only the global near line is pre-charged, due to the connection to the NOR gate 380. Due to the splitting of the global bit line, during a read of the near banks 350, GBL Far remains in a steady state. Again, GBL Near will be pre-charged at the end of the access operation, but will not be in a floating state during any stage, which means that accuracy of read results can be improved.

As the far and near global bitlines are driven by a corresponding NAND or NOR gate, there is no need for NMOS transistors to act as pre-charge circuits, meaning that neither GBL Far no GBL Near will be in a floating state during any stage of an access operation. Further, only GBL Near needs to be pre-charged for a near bank read, which reduces the power consumption for near bank access operations. Finally, the RC delay of the global bitline will be reduced, which means there will be improved gain at high voltage. Power consumption can be reduced by as much as 20%.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A multi-bank memory comprising:

a pair of far banks coupled to a first word line and a first pair of local bitlines, respectively;

a pair of near banks coupled to a second word line and a second pair of local bitlines, respectively;

a far global bit line coupled to the first pair of local bitlines;

a NOR gate having a first input coupled to the second pair of local bitlines and a second input coupled to the far global bit line;

a near global bit line coupled to the output of the NOR gate; and a global input/output (I/O) circuit, coupled to the near global bit line, for outputting data;

wherein during an access operation of the pair of far banks, data on the first pair of local bitlines will be carried on the far global bit line and the near global bit line, and during an access operation of the pair of near banks, data on the second pair of local bitlines will be carried on the near global bit line.

2. The multi-bank memory of claim 1, wherein the first pair of local bit lines comprises a top local bit line coupled to a first bank of the pair of far banks and a bottom local bit line coupled to a second bank of the pair of far banks, and the pair of far banks further comprise a first NAND gate, having a first input coupled to the top local bit line, a second input coupled to the bottom local bit line, and an output coupled to the far global bit line.

3. The multi-bank memory of claim 2, wherein the second pair of local bit lines comprises a top local bit line coupled to a first bank of the pair of near banks and a bottom local bit line coupled to a second bank of the pair of near banks, and the pair of near banks further comprise a second NAND gate, having a first input coupled to the top local bit line, a second input coupled to the bottom local bit line, and an output coupled to the first input of the NOR gate.

4. The multi-bank memory of claim 2, wherein the near global bitline is pre-charged via the NOR gate, and when a read operation is performed for the pair of far banks, the far global bit line goes high in response to one of the top local bit line and bottom local bit line discharging, the near global bit line discharges in response to the far global bit line going high, and when the read operation ends, the far global bit line is discharged via the first NAND gate.

5. The multi-bank memory of claim 3, wherein the near global bitline is pre-charged via the NOR gate, and when a read operation is performed for the pair of near banks, the near global bitline discharges in response to the output of the second NAND gate, and the far global bitline remains in a steady state.

6. The multi-bank memory of claim 1, wherein the pair of far banks comprise a first far bank and a second far bank, wherein both of the first far bank and the second far bank comprise a plurality of cells coupled together by the first word line; and the pair of near banks comprise a first near bank and a second near bank, wherein both of the first near bank and the second near bank comprise a plurality of cells coupled together by the second word line.

7. The multi-bank memory of claim 1, being an SRAM.

* * * * *